US007068794B2

(12) United States Patent
Kim

(10) Patent No.: US 7,068,794 B2
(45) Date of Patent: Jun. 27, 2006

(54) SMART PANEL FOR DECREASING NOISE IN WIDE BAND FREQUENCY

(75) Inventor: Jae Hwan Kim, Inchon-shi (KR)

(73) Assignee: INHA Industry Partnership Institute (KR)

( * ) Notice: Subject to any disclaimer, the term of this patent is extended or adjusted under 35 U.S.C. 154(b) by 824 days.

(21) Appl. No.: 09/805,304

(22) Filed: Mar. 12, 2001

(65) Prior Publication Data

US 2001/0022847 A1 Sep. 20, 2001

(30) Foreign Application Priority Data

Mar. 15, 2000 (KR) .............................. 2000-13149

(51) Int. Cl.
*H03B 29/00* (2006.01)

(52) U.S. Cl. .................................................... 381/71.7

(58) Field of Classification Search .................. 381/77, 381/71.7, 354, 164, 152, 71.2, 322, 321, 381/353, 190, 431, 71.5, 162; 367/176, 162; 181/284, 208, 210, 290, 280, 151, 293; 310/51, 310/322, 317, 323, 326, 321, 311, 316.01, 310/319, 327, 331, 334; 52/144, 145
See application file for complete search history.

(56) References Cited

U.S. PATENT DOCUMENTS 4,158,787 A * 6/1979 Forward ...................... 310/51
5,355,417 A * 10/1994 Burdisso et al. ........... 381/71.7
5,485,053 A * 1/1996 Baz ............................ 310/326
5,783,898 A * 7/1998 Wu ....................... 310/316.01
6,102,426 A * 8/2000 Lazarus et al. ............. 280/602
6,193,032 B1 * 2/2001 Lesieutre et al. ........... 310/317
6,563,250 B1 * 5/2003 Mathur .................. 310/316.01
6,870,303 B1 * 3/2005 Park ........................... 310/319

FOREIGN PATENT DOCUMENTS

GB 2312972 A * 11/1997

* cited by examiner

*Primary Examiner*—Sinh Tran
*Assistant Examiner*—Andrew Graham
(74) *Attorney, Agent, or Firm*—Roth & Goldman, P.A.

(57) ABSTRACT

The present invention relates to a soundproof panel, and in particular to a smart panel for decreasing a noise in a wide band. The smart panel according to the present invention includes a board structure for decreasing a noise of an audible frequency band, a sound absorption member attached to one surface of the board structure for decreasing the noise of an audible frequency band, and a piezoelectric unit attached to the board structure for decreasing the noise when the same audible frequency as the resonance frequency of the smart panel is propagated for thereby maximizing the insertion loss in the resonance frequency of the smart panel.

3 Claims, 5 Drawing Sheets

( a )

( b )

SMART PANEL FOR DECREASING NOISE IN WIDE BAND FREQUENCY

BACKGROUND OF THE INVENTION

1. Field of the Invention

The present invention relates to a soundproof panel, and in particular to a smart panel capable of decreasing a noise in a wide band frequency.

2. Description of the Background Art

Generally, a panel is formed of a board member (or a board structure) or a combined member of a board member and a sound absorption member or two kinds of board members and a sound absorption member. The above-described panel has an insertion loss decreased in a resonance frequency of the panel. As the use of a sound absorption is increased, an insertion loss is increased in an intermediate frequency and a high frequency band. An insertion loss of a panel having a double board member is increased compared to a panel of a single board member. The insertion loss may be decreased in a resonance frequency of a space formed by a board member and two board members.

Namely, the insertion loss of the panel may be increased in an intermediate/high frequency band by coupling an absorption member with a board member. In this case, it is impossible to prevent a decrease of an insertion loss in a resonance frequency of a panel.

In order to prevent the decrease of an insertion loss in a resonance frequency, there is a method in which a viscoelasticity member is attached to a board member. However, since the elastic member has a characteristic in which the viscoelasticity characteristic is decreased in a wide frequency region. Therefore, it is impossible to obtain a certain characteristic which is proper to a certain frequency. In addition, the weight of the board member is increased due to a viscoelasticity member attached for increasing the decreasing effect of the viscoelasticity characteristic. The increase of the mass may cause an additional driving force for a transfer mechanism for thereby decreasing the performance of the system.

SUMMARY OF THE INVENTION

Accordingly, it is an object of the present invention to provide a smart panel for decreasing a noise in a wide band frequency which is capable of maximizing a soundproof effect by preventing a decrease of an insertion loss in a resonance frequency of the smart panel.

It is another object of the present invention to provide a smart panel for decreasing a noise in a wide band frequency which is capable of increasing an insertion loss in a resonance frequency of a smart panel and maximizing a soundproof effect by increasing an insertion loss in an intermediate/high frequency band.

In the present invention, a piezoelectric member connected with a shunt circuit is attached to the board structure, and a piezoelectric damping effect is obtained for changing an electric energy which occurs in the piezoelectric member into a thermal energy based on a tuning operation of the shunt circuit for thereby maximizing the insertion loss at the resonance frequency of the smart panel.

To achieve the above objects, there is provided a smart panel for decreasing a noise in a wide band frequency which includes a board structure for decreasing a noise of an audible frequency band, a sound absorption member attached to one surface of the board structure for decreasing a noise of an audible frequency band, and a piezoelectric unit attached to the board structure for decreasing the noise when the same audible frequency as the resonance frequency of the smart panel is propagated.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
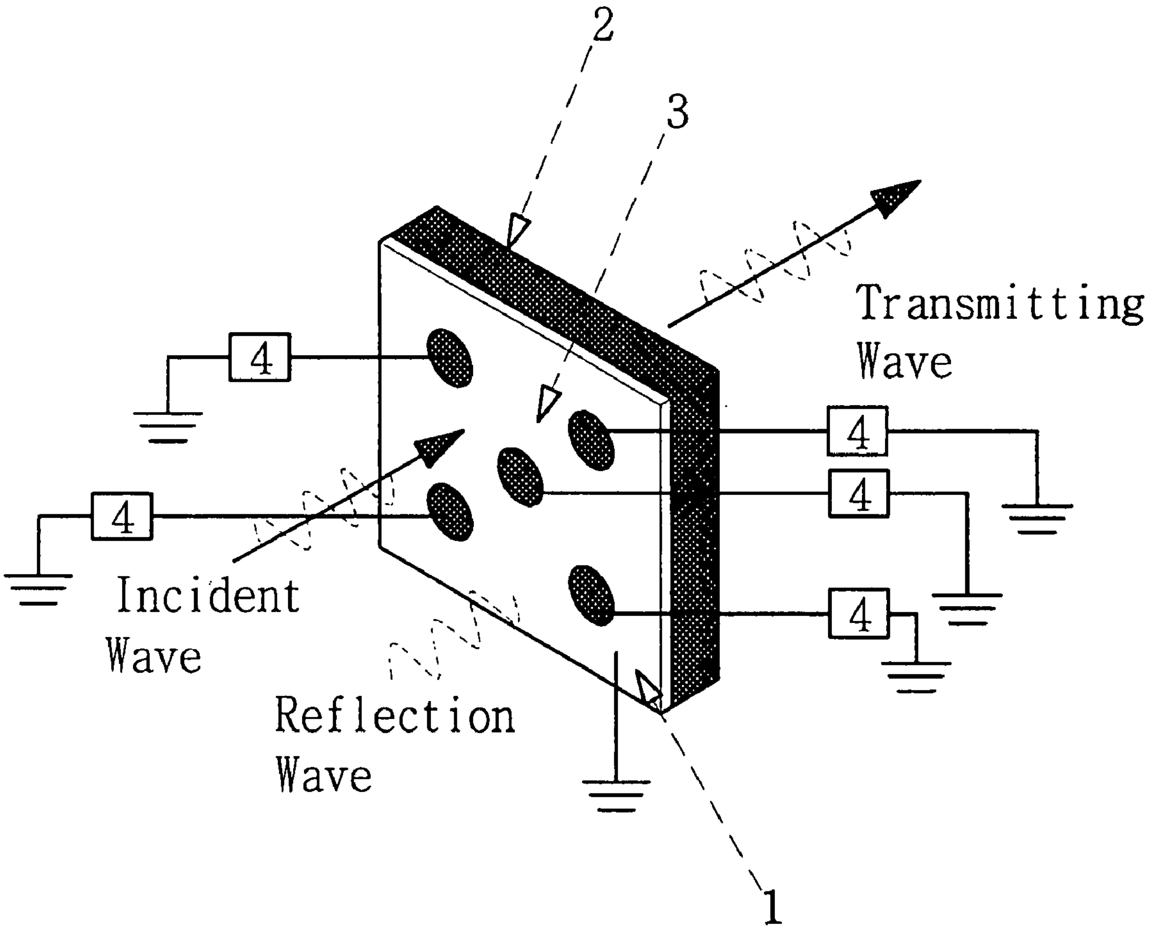
FIG. 1 is a view illustrating a smart panel according to an embodiment of the present invention.
Figure 2:
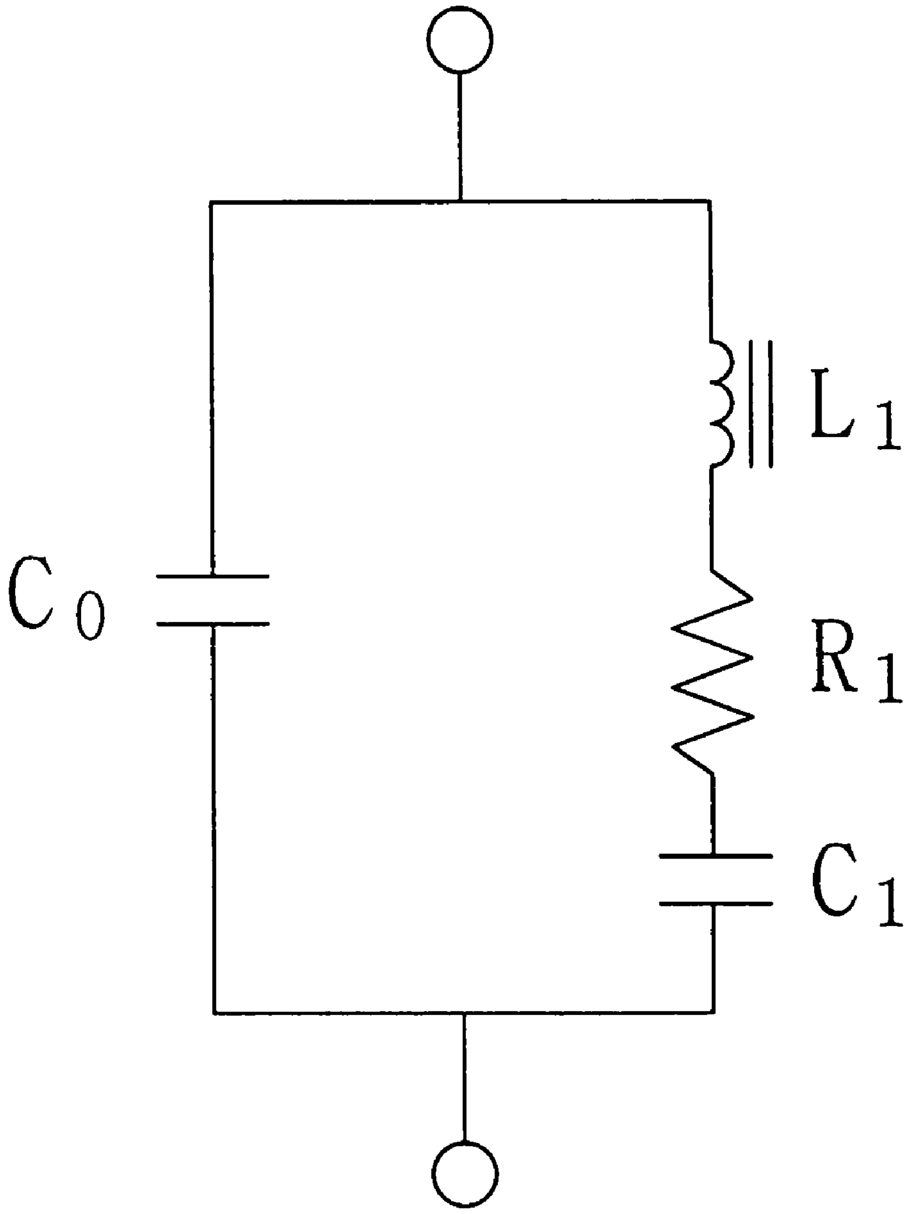
FIG. 2 is an equivalent circuit diagram illustrating an electrical characteristic of a piezoelectric member according to the present invention.
Figure 3:
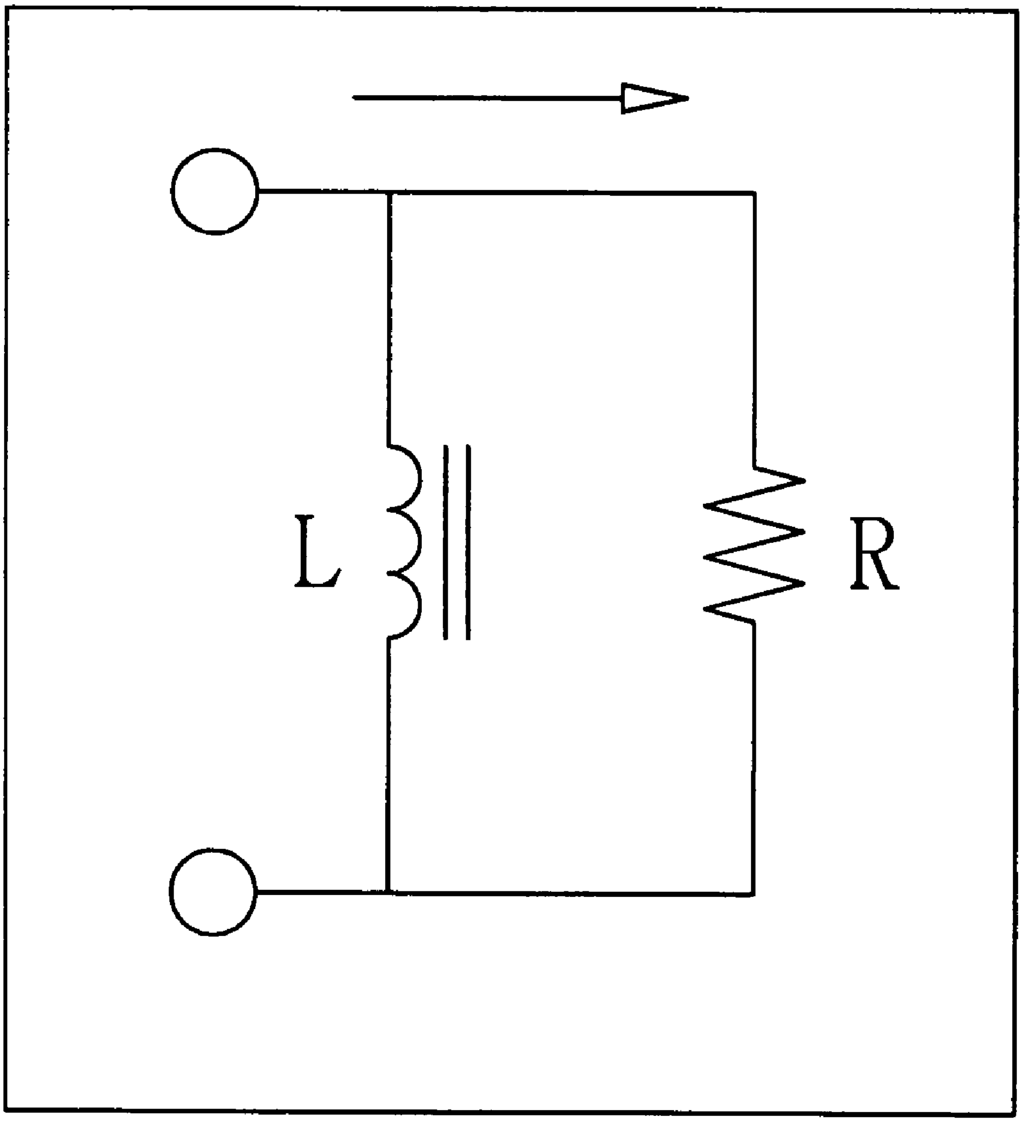
FIG. 3 is a view illustrating a shunt circuit of FIG. 1.
Figure 3:
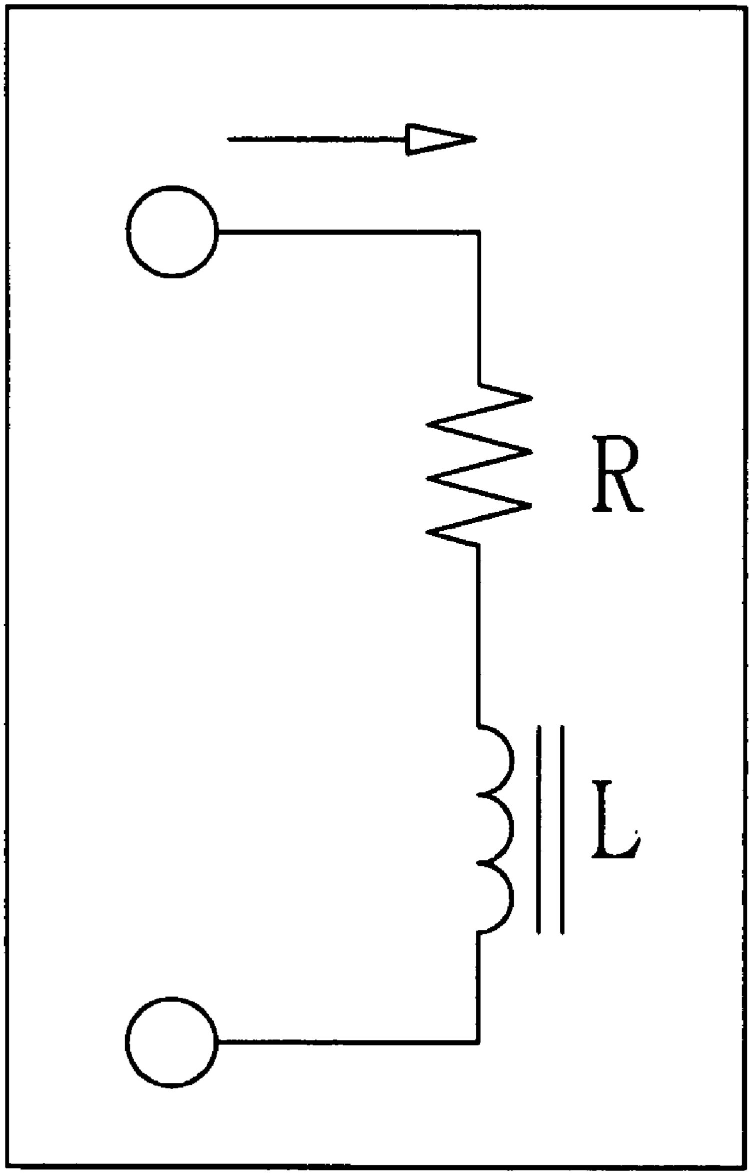

FIG. 1 is a view illustrating a smart panel according to an embodiment of the present invention, FIG. 2 is an equivalent circuit diagram illustrating an electrical characteristic of a piezoelectric member according to the present invention, and FIG. 3 is a view illustrating a shunt circuit of FIG. 1.

A smart panel according to an embodiment of the present invention includes a board structure 1, a sound absorption member 2, a piezoelectric member 3, and a shunt circuit 4. The board structure 1 supports the sound absorption member and decreases a noise in an audible frequency band. The sound absorption member 2 is attached to one side of the board structure 1 for decreasing a noise of an audible frequency band. A piezoelectric unit includes a plurality of piezoelectric members 3 attached to another side of the board structure 1, and a shunt circuit 4 electrically connected with each piezoelectric member 3 for increasing an insertion loss (namely, a soundproofing effect) in the resonance frequency of the smart panel. The piezoelectric member 3 and the shunt circuit 4 are connected for obtaining a maximum soundproof effect by measuring an electrical impedance value of the piezoelectric member 3 attached to the board structure 1 and adjusting the impedance value through the shunt circuit 4 for thereby implementing an electrical resonance The operation of the smart panel according to the present invention will be explained. When a sound and vibration energy which transfers energy in a noise form reaches at the smart panel, a part of the energy is absorbed by the board structure 1, and almost part of the noise having a certain audible frequency band is absorbed by the sound absorption member 2. However, the noise having a resonance frequency of the smart panel is not absorbed by the smart panel but transmits. In order overcome the above problems, the piezoelectric member 3 is attached to the board structure 1. At this time, the piezoelectric member 3 is preferably attached to an anti-nodal point which generates a maximum displacement of the board structure 1. Here, the points which generate the maximum displacement correspond to the points which maximize the insertion loss. Generally, it represents that the vibration of the board member is highest. However, when the frequency is varied, the position is changed. Therefore, an optimization method is used. When the excitation frequency range is determined, the vibration mode which generates the sound in maximum is checked in the above range for thereby determining the anti-nodal point of the mode in which the sound generation is maximized. If there are a plurality of modes in the excitation frequency range, it is difficult to determine. Therefore, the points are optimized. The piezoelectric member 3 is attached to the board structure 1. When the noise having a resonance frequency component of the smart panel transfers the pressure to the piezoelectric member 3, the vibration energy and sound energy are converted into an electrical energy by the piezoelectric member 3. As shown in FIG. 2, the piezoelectric member 3 may be formed of a resistor, an inductor, and a capacitor.

If a resonance does not occur in the piezoelectric member 3, it is impossible to receive the vibration and noise in a maximum energy which is received by the piezoelectric member 3. In order to overcome the above problem, the shunt circuit 4 is connected with the piezoelectric member 3. The shunt circuit 4 is tuned so that an electrical resonance occurs together with the electric component of the piezoelectric member 3, so that the piezoelectric member 3 absorbs the maximum energy amount. Namely, the characteristic of the shunt circuit 4 obtains a noise reduction effect in the smart panel having different resonance frequency.

The tuning method for obtaining an electric resonance by the piezoelectric unit will be explained. The piezoelectric member 3 is attached to the board structure 1, and then an electric impedance is measured at the piezoelectric member 3. The sizes of the resistor R and the inductor L of the shunt circuit 4 are adjusted so that the smart panel has an electric resonance based on the measured impedance. A plurality of the piezoelectric members 3 are attached at the maximum displacement point of the board structure film 1, and then an electric impedance is measured using the impedance measuring unit. The measured impedance of the piezoelectric member 3 is formed in a Van Dyke model which is an equivalent circuit mode of the piezoelectric member 3 based on the electric impedance of the piezoelectric member 3 attached to the board structure 1. Each coefficient of the Van dyke model is obtained using an exclusive program. As shown in FIG. 3, the shunt circuit 4 is a circuit in which the resistor R and the inductor L are connected in series or in parallel. The shunt circuit 4 is connected with the Van Dyke model which represents each resonance mode of the smart panel. The values of the resistor R and the inductor L of the shunt circuit 4 are designed for thereby obtaining the maximum electric energy value. Namely, it is designed so that the electric resonance is obtained. The above tuning process is performed with respect to each resonance mode, so that it is possible to implement an electric resonance with respect to the multiple mode.

Figure 4:
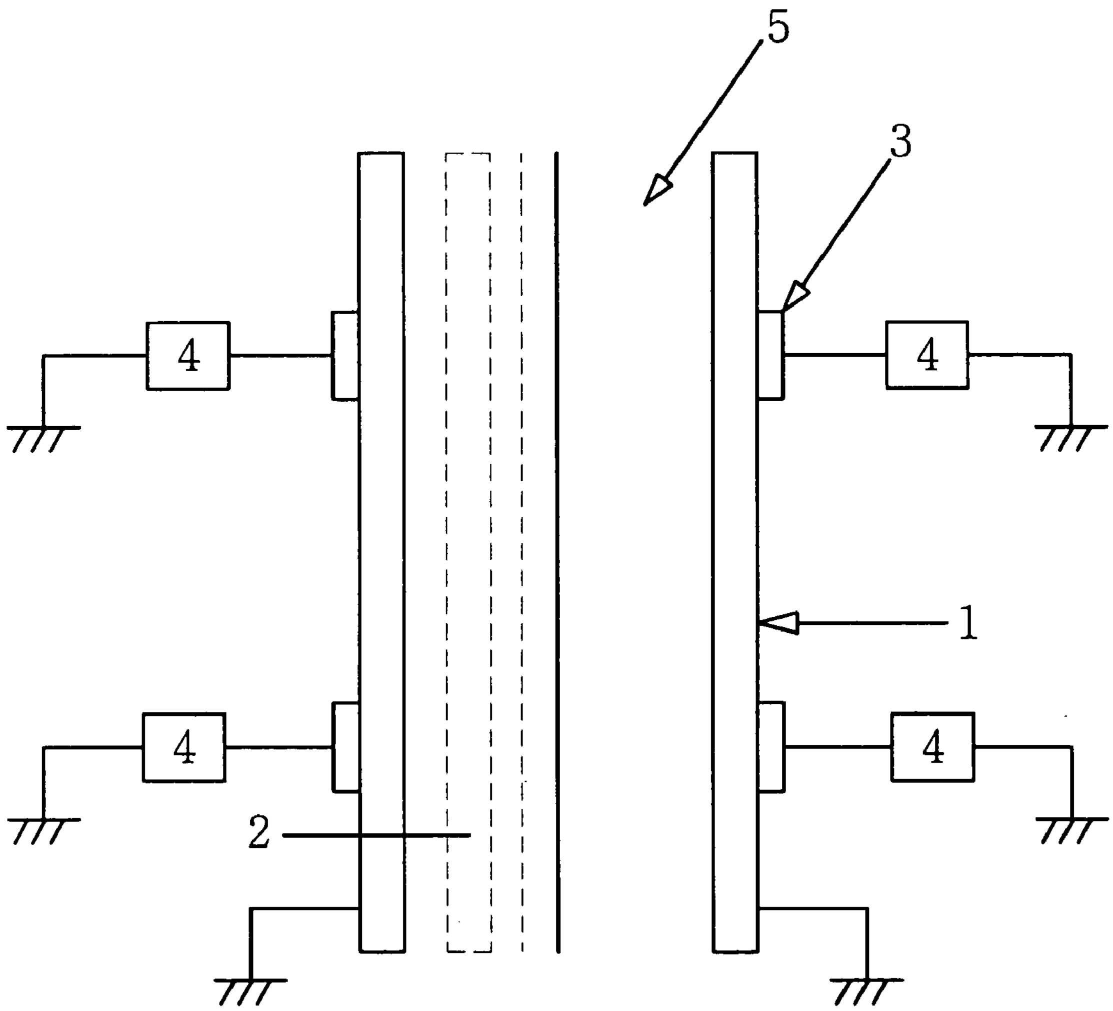
FIG. 4 is a view illustrating a smart panel according to another embodiment of the present invention.

FIG. 4 is a view illustrating the smart panel according to another embodiment of the present invention. The smart panel according to another embodiment of the present invention includes a plurality of board structures 1 which are distanced from each other by a certain distance, a sound absorption member 2 attached one board structure 1 among the board structures 1 for forming an air layer 5 between the remaining board structures 1, and a piezoelectric member 3 and a shunt circuit 4 of the piezoelectric unit. The board structures 1 decrease the noise of the audible frequency band, and the sound absorption member 3 is attached to an inner surface of one board structure 1 among the board structures 1 for thereby decreasing the noise of the audible frequency band. The piezoelectric member 3 which is a component of the piezoelectric unit is attached to the opposite surface of the board structure 1. Each shunt circuit 4 is electrically connected with the piezoelectric member 3 attached to the board structure 1.

The electric impedance value of the piezoelectric member 3 attached to the board structure 1 of FIG. 1 is measured with respect to the smart panel as shown in FIG. 4, and then the impedance value is adjusted through the shunt circuit 4 for thereby obtaining an electric resonance, whereby it is possible to obtain the maximum soundproof effect.

In the above embodiments of the present invention, the air layer 5 is formed between the sound absorption member 2 and the board structure 1 as shown in FIG. 4. In a preferred embodiment of the present invention, the smart panel may be implemented by inserting the sound absorption member 2 between the board structures 1 without forming the air layer 5.

As described above, in the present invention, it is possible to maximize the soundproof effect by preventing the insertion loss decrease in the smart panel resonance frequency by electrically resonating the piezoelectric member attached to the board structure through the shunt circuit. In addition, the performance of the smart panel may be maximized by easily implementing the piezoelectric reduction with respect to the multiple modes of the smart panel.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. A smart panel for reducing noise over a wide bandwidth, said smart panel having an audible resonance frequency, comprising:

a pair of board structures which generate noise in an audible frequency band, said board structures being separated by an air layer;

a sound absorption member for decreasing noise generated by said board structures in an audible frequency band, said sound absorption member being attached to a face surface of at least one of said board structures which faces the other one of said board structures; and a piezoelectric unit attached to an anti-nodal point of each of said board structures for decreasing noise generated by said board structures when said audible resonance frequency is propagated, said piezoelectric units being on face surfaces of said board structures opposite said sound absorption member and air layer, said piezoelectric units comprising a piezoelectric member and a tunable shunt circuit connected with said piezoelectric member for electrically resonating impedance of said piezoelectric member.

2. The smart panel of claim 1 wherein said shunt circuit includes resistive and inductive components.

3. The smart panel of claim 2, further comprising a plurality of said piezoelectric units each attached to anti-nodal points of one of said board structures on a face surface of said one board structure opposite said sound absorption member.

* * * * *